United States Patent [19]

Stikvoort

[11] Patent Number: 4,797,845
[45] Date of Patent: Jan. 10, 1989

[54] PHASE-LOCKED LOOP COEFFICIENT GENERATOR FOR A FILTER ARRANGEMENT HAVING A NON-RATIONAL RATIO BETWEEN INPUT AND OUTPUT SAMPLING FREQUENCIES

[75] Inventor: Eduard F. Stikvoort, Eindhoven, Netherlands

[73] Assignee: U.S. Philips Corporation, New York, N.Y.

[21] Appl. No.: 940,326

[22] Filed: Dec. 11, 1986

[30] Foreign Application Priority Data

Dec. 18, 1985 [NL] Netherlands ..................... 8503478

[51] Int. Cl.$^4$ ..................... G06F 7/38; H03H 17/06
[52] U.S. Cl. ..................... 364/724.1; 341/123
[58] Field of Search ..................... 364/724, 723; 340/347 DD

[56] References Cited

U.S. PATENT DOCUMENTS

| | | | |
|---|---|---|---|
| 3,829,670 | 8/1974 | Kebabian ..................... | 364/724 |
| 4,020,332 | 4/1977 | Crochiere et al. ..................... | 364/723 |
| 4,270,026 | 5/1981 | Shenoi et al. ..................... | 364/723 X |
| 4,460,890 | 7/1984 | Busby ..................... | 340/347 DD |
| 4,584,659 | 4/1986 | Stikvoort ..................... | 364/724 |
| 4,604,720 | 8/1986 | Stikvoort ..................... | 364/724 |

Primary Examiner—Gary V. Harkcom
Assistant Examiner—Tan V. Mai
Attorney, Agent, or Firm—Gregory P. Gadson

[57] ABSTRACT

In a sample rate converter having a non-rational conversion factor the input samples coincide with low-rate clock pulses and the output samples coincide with high-rate clock pulses, or inversely. It comprises a filter coefficient generator which, based on the distance (deviation) between a low-rate clock pulse and the immediately preceding or immediately subsequent high-rate clock pulse, continuously supplies a series of filter coefficients. To determine the deviation a phase-locked loop is provided, with a phase detector receiving the low-rate clock pulses as well as synthetic low-rate clock pulses and supplying a discrete-time phase difference signal which is applied to a processor circuit. This circuit supplies the desired deviation and a reference number which is applied to a counter circuit. This circuit also receives the high-rate clock pulses and each time after receiving the number of clock pulses corresponding to the reference number it supplies a synthetic low-rate clock pulse. In the processor circuit a filtering operation is first performed on the discrete-time phase difference signal so that control signal samples are obtained. An auxiliary sample is subtracted from such a control signal sample and the difference is divided by a weighting factor of the number P thus obtained those bits whose significance is less than $2°$ represent the deviation, while the other bits represent the reference number. By subsequently multiplying the deviation by the weighting factor, a new auxiliary sample is obtained.

4 Claims, 5 Drawing Sheets

PHASE-LOCKED LOOP COEFFICIENT GENERATOR FOR A FILTER ARRANGEMENT HAVING A NON-RATIONAL RATIO BETWEEN INPUT AND OUTPUT SAMPLING FREQUENCIES

BACKGROUND OF THE INVENTION (1) Field of the invention

The invention relates in broad outline to an arrangement for changing the sampling frequency $f_i$ of a discrete-time signal into a sampling frequency $f_u$. An arrangement of this type will hereinafter be referred to as sample rate converter and the ratio $f_u/f_i$ will be referred to as the conversion factor. The invention particularly relates to a sample rate converter in which the conversion factor is non-rational (for example, $\sqrt{2}$ or $1/\sqrt{2}$).

(2) Description of the prior art

Sample rate converters have been generally known for many years. They are used to increase or decrease the sampling frequency of a discrete-time signal. In the former case, the converter is sometimes referred to as an interpolator, in the latter case as a decimator. For a general background about interpolators and decimators, reference is made to the references 1-6 in section C.

A sample rate converter generally comprises a signal processing circuit. The discrete-time signal is applied thereto as an input signal whose sampling frequency must be changed, and furthermore receives so-called filter coefficients. It supplies the desired discrete-time signal as an output signal. Each sample of this discrete-time output signal is equal to the sum of a number of, for example, M samples of the discrete-time input signal in which each of these input samples is weighted with a filter coefficient.

To calculate an output sample, a group of M filter coefficients must be principally available. These filter coefficients are supplied by a filter coefficient generator and, as is known, represent samples of the finite pulse response h(v) of a predetermined filter (v is a continuously variable in the interval $-\infty < v < \infty$).

If the sample rate converter is a decimator, and if the conversion factor is 1/R, with R being an integer, it does not supply an output sample until after it has received R input samples. For the calculation of each output sample the same group of M filter coefficients is used. A memory in which the M filter coefficients are stored may be used as a filter coefficient generator.

If the sample rate converter is an interpolator, and if the conversion factor is equal to R, it supplies R output samples whenever a new input sample has been received. For each of these R output samples the filter coefficient generator must supply an appropriate group of filter coefficients. Also, in this case, a memory in which the required (for example, RM) filter coefficients are stored may be used as a filter coefficient generator.

When, as in the above described cases, the quantity R is an integer, the required filter coefficients are invariable. The situation is entirely different when R is non-rational. In that case the required filter coefficients for each output sample must be calculated separately. Filter coefficient generators that can fulfill this task have been described extensively in references 7 and 8 (listed in the References section below). More particularly, reference 7 describes a decimator, whereas reference 8 describes an interpolator. Each filter coefficient generator used therein comprises a deviation circuit to which on the one hand, clock pulses occurring at a "low" rate $f_l$ (hereinafter referred to as low-rate clock pulses), and on the other hand, clock pulses occurring at a "high" rate $f_h$ (hereinafter referred to as high-rate clock pulses) are applied. Each time after a low-rate clock pulse has occurred, this deviation circuit supplies a deviation d whose magnitude is proportional to the ratio between the time interval $T_d$ between this low-rate clock pulse and the immediately subsequent or immediately preceding high-rate clock pulse and the time interval $1/f_h$ between two consecutive high-rate clock pulses. In a mathematical form this is:

$$d = T_d \cdot f_h \qquad (1)$$

The deviation d thus obtained is applied to a calculation circuit which, starting from the predetermined pulse response h(v), calculates the required filter coefficients. When the $m^{th}$ filter coefficient to be calculated is symbolically represented by a(m), there applies that:

$$a(m) = h(d+m)/f_h \qquad (2)$$

If the sample rate converter is a decimator, as in reference 7, $f_h$ is equal to the sampling frequency $f_i$ of the input signal and $f_l$ is equal to the sampling frequency $f_u$ of the output signal. If the sample rate converter is an interpolator, these equalities are reversed.

OBJECT AND SUMMARY OF THE INVENTION

The deviation circuits as extensively described in the said references 7 and 8 are found to require a considerable amount of hardware in practice.

It is therefore an object of the invention to provide a simpler embodiment of a deviation circuit of this type.

According to the invention the deviation circuit comprises a phase detector to which the low-rate clock pulses are applied on the one hand, and to which synthetic low-rate clock pulses are applied on the other hand, and which supplies a discrete-time phase difference signal;

a counter circuit adapted to receive a reference value, which circuit receives the high-rate clock pulses as counting pulses and supplies a synthetic low-rate clock pulse for the phase detector each time after receiving a number of high-rate clock pulses which is equal to the reference value; and a processor circuit which receives the discrete-time phase difference signal and in response thereto supplies deviations d at the low rate $f_1$, as well as reference values for the counter circuit.

Functionally, this deviation circuit constitutes a phase-locked loop in which a generator is used as a voltage-controlled oscillator supplying a sawtooth signal, the height of the sawtooth being determined by the phase difference signal, and the slope being constant.

The implemented phase-locked loop as defined above does not, however, actually supply this sawtooth signal in a complete form. On the other hand, the processor ciruzit supplies a reference value which indicates how many high-rate clock pulses fit into one period of the sawtooth signal and this period must be equal to the period with which the low-rate clock pulses are applied to the phase detector. The processor circuit which is used in combination with the counter circuit for generating the synthetic clock pulses is also used for calculating the deviation d so that no extra hardware is required for this purpose.

REFERENCES

1. A Digital Signal Processing Approach to Interpolation; R. W. Schafer, L. R. Rabiner; Proceedings of the IEEE, Vol. 61, No. 6, June 1973, pages 692–702.
2. Arrangement for Converting Discrete Signals into a Discrete Single-Sideband Frequency Division-Multiplex-Signal and Vice Versa; T. A. C. M. Claasen, W. F. G. Meckenbräuker; U.S. Pat. No. 4,131,764. (This patent specification is equivalent to Netherlands patent application No. 77,03,633 (PHN 8731)).
3. Low Pass Nonrecursive Digital Filter; M. Bellanger, G. G. Lepagnol, J. Daguet; U.S. Pat. No. 3,928,755. (This patent specification is equivalent to Netherlands patent application No. 74,00,761 (PHN 6883)).
4. Interpolating Digital Filter; L.D. J. Eggermont, H. A. van Essen, P. J. van Gerwen, W. A. M. Snijders; U.S. Pat. No. 3,988,607. (This patent specification is equivalent to Netherlands patent application No. 74,12,224 (PHN 7733)).
5. Interpolating Digital Filter with Input Buffer; H. A. van Essen, N. A. M. Verhoeckx, W. A. M. Snijders; U.S. Pat. No. 3,997,773. (This patent specification is equivalent to Netherlands patent application No. 74,12,225 (PHN 7729)).
6. Interpolation-Decimation Circuit for Increasing or Decreasing Digital Sampling Frequency; R. E. Crochiere, L. R. Rabiner; U.S. Pat. No. 4,020,332.
7. Decimation Filter Arrangement; E. P. Stikvoort; Published European patent application No. 0,099,600 (PHN 10 394).
8. Interpolating Filter Arrangement with Inrational Ratio between the Input and the Output Sampling Frequencies; E. P. Stikvoort; Published European patent application No. 0,151,829 (PHN 10 899).

Figure 1:
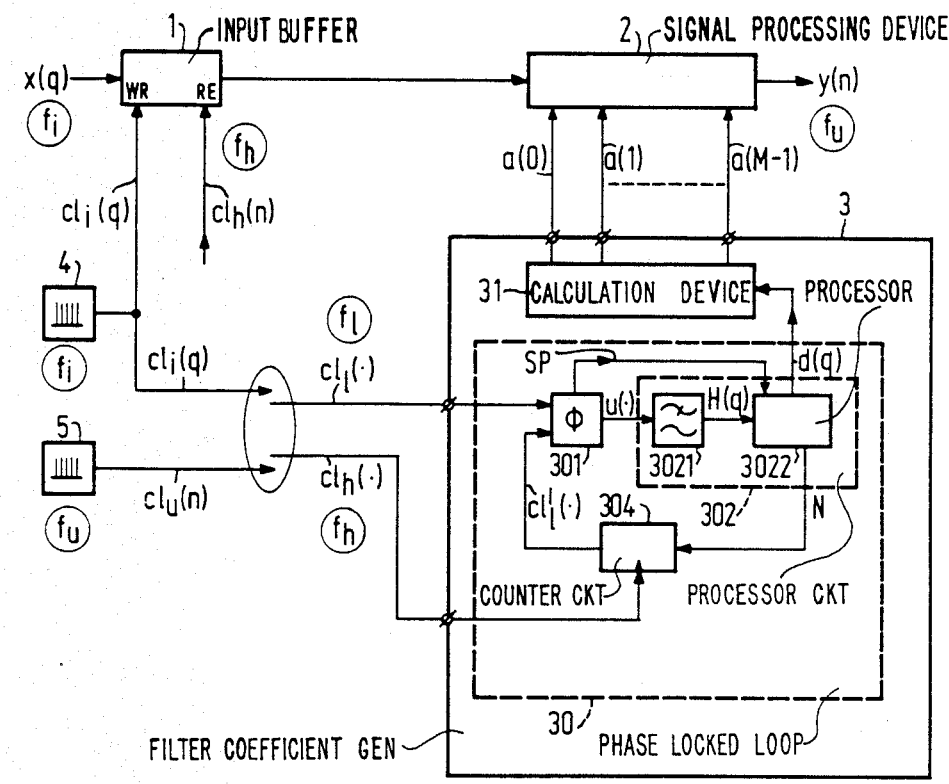
FIG. 1 diagrammatically shows the general structure of a sample rate converter.

DESCRIPTION OF THE EMBODIMENTS (1) General structure of a sample rate converter FIG. 1 diagrammatically shows the general structure of a sample rate converter having a non-rational conversion factor. It is provided with an input buffer 1 through which the input samples $x(q)$ which occur at a rate $f_i$ are applied to a signal processing device 2 supplying output samples $y(n)$ at the desired rate $f_u$. For calculating each output samples $y(n)$ the signal processing device 2 also receives M filter coefficients $a(0), a(1), \ldots a(M-1)$ from a filter coefficient generator 3.

The buffer 1 has a write input WR and a read input RE. The write input WR receives a clock signal $cl_i$ consisting of clock pulses $cl_i(.)$ occurring at the input sampling frequency $f_i$. The input sample $x(q)$ is stored in this buffer in response to a clock pulse $cl_i(.)$. The read input RE receives a clock signal $cl_h$ consisting of clock pulses $cl_h(.)$ which occur at a frequency $f_h$, and will be referred to as high-rate clock pulses. Whenever such a high-rate clock pulse $cl_h(.)$ occurs, the contents of the buffer are transferred to the signal processing device 2, and the buffer is also reset. Thus it is achieved that if no input sample is stored in the buffer between two consecutive high-rate clock pulses, a sample having the value zero is applied to the signal processing device 2. This situation occurs when the sample rate converter is an interpolator.

The signal processing device 2 may be implemented in known manner. For example, in the manner as described in reference 7 when the sample rate converter is a decimator and in the manner as described in reference 8 when it is an interpolator.

The clock pulses $cl_i(.)$ occurring at the input sampling frequency $f_i$ are supplied by a clock pulse generator 4. It will be assumed that there is also a clock pulse generator 5 supplying a clock signal consisting of the clock pulses $cl_u(.)$ occurring at the output sampling frequency $f_u$. Since a sample rate converter is concerned in this case, the output sampling frequency will be either higher or lower than the input sampling frequency. The previously mentioned clock signal $cl_h$ consisting of the high-rate clock pulses $cl_h(.)$ is now formed by one of the two clock signals $cl_i$ and $cl_u$, more specifically by the clock signal whose clock pulses occur at the highest rate. For the purpose of simplification of the following, the other clock signal will be indicated by $cl_l$, and its clock pulses with $cl_l(.)$. The rate at which these clock pulses occur will be indicated by $f_l$ and they will be referred to as low-rate clock pulses.

The clock pulses $cl_h(.)$ and $cl_l(.)$ are applied to the filter coefficient generator 3 and utilized therein for calculating the deviation d on the one hand and the required coefficients $a(m)$ on the other hand. To this end, this filter coefficient generator 3 is provided with a phase-locked loop 30 and a calculation device 31. In response to each low-rate clock pulse $cl_l(.)$, the phase-locked loop 30 supplies a deviation $d(.)$ which is applied to the calculation device 31 (for example, a microcomputer). The latter is adapted to calculate the required filter coefficients at the given value of $d(.)$ in accordance with expression (2).

The phase-locked loop 30 comprises more particularly a counter circuit 301, a processor circuit 302 and a counter circuit 304. In the embodiment shown the processor circuit 302 is constituted by the cascade arrangement of a loop filter 3021 and a processor 3022. The phase detector 301 receives the low-rate clock pulses $cl_l(.)$ at one of its inputs and synthetic low-rate clock pulses $cl'_l(.)$ at the other input, which latter pulses are supplied by the counter circuit 304. This phase detector supplies a discrete-time phase difference signal u in which each phase difference sample $u(.)$ is a measure of the time interval between a clock pulse $cl_l(.)$ and the immediately subsequent or immediately preceding synthetic clock pulse $cl'_l(.)$. The discrete-time phase difference signal thus obtained is subjected in the loop filter 3021 to a discrete-time filter processing operation. As a result of and in response to each low-rate clock pulse $cl_l(.)$, this loop filter supplies a control signal sample $H(.)$ which is processed in the processor 3022. This processor is programmed in a manner to be described hereinafter so that on the one hand it supplies the deviation $d(.)$, and on the other hand a number $N(.)$ which indicates how many high-rate clock pulses fit into one period of a hypothetical sawtooth signal having the same slope in each period but whose sawtooth height and thus also the actual period is proportional to the actual control signal sample H(.) supplies by the loop filter. This number N(.) is applied to the counter circuit 304. This circuit 304 also receives the high-rate clock pulses via a clock pulse input and supplies a synthetic clock pulse cl'$_l$(.) when N(.) high-rate clock pulses have been received. Therefore this counter circuit 304 may advantageously be designed as a presettable down counter.

It is to be noted that the phase detector 301 supplies a control pulse SP simultaneously with a phase difference sample u(.), which pulse is applied to the processor circuit for its initialization.

(2) Theoretical background of the invention

Figure 2:
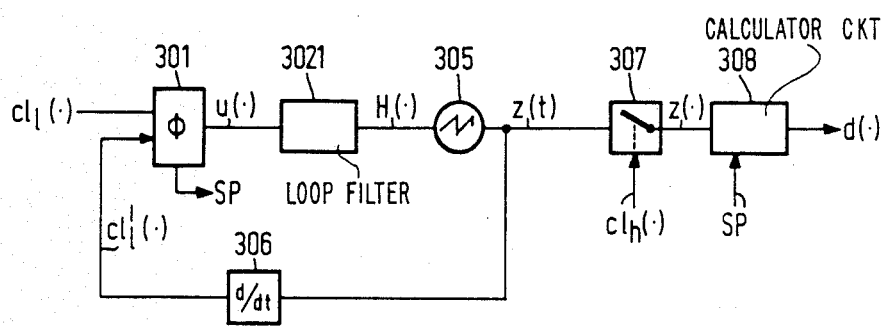
FIG. 2 shows the theoretical model of the phase-locked loop shown in FIG. 1.

The embodiment of the phase-locked loop shown in FIG. 1 is a practical embodiment of the theoretical model shown in FIG. 2. In addition to the phase detector 301 and the loop filter 302, this model comprises a sawtooth oscillator 305 and a differentiating network 306. The phase detector 301 again receives the low-rate clock pulses cl$_l$(.) and cl'$_l$(.) and supplies in response to each low-rate clock pulse a difference signal sample u(.) which is a measure of the phase difference between the last received low-rate clock pulse cl$_l$(.) and the immediately subsequent or immediately preceding low-rate clock pulse cl'$_l$(.). After filtering of the phase difference samples by the loop filter 3021, a control signal sample H(.) is obtained which controls the sawtooth oscillator 305. All sawteeth supplied by this oscillator have the same slope. Their tooth height is, however, equal or proportional to the actual control signal sample H(.). Whenever the sawtooth has reached this tooth height, a new sawtooth starts and the differentiating network 306 supplies a low-rate synthetic clock pulse cl'$_l$(.).

Figure 3A:
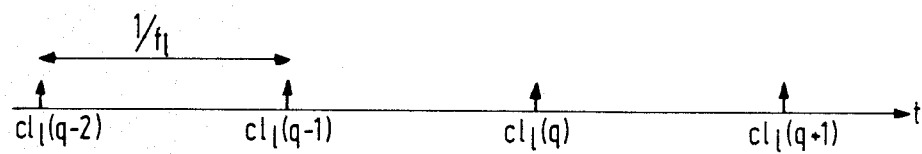
FIGS. 3A–3C, 4A–4E and 5 show some diagrams to explain the operation of the filter coefficient generator shown in FIG. 1.
Figure 3B:
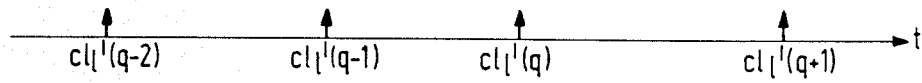
Figure 3C:
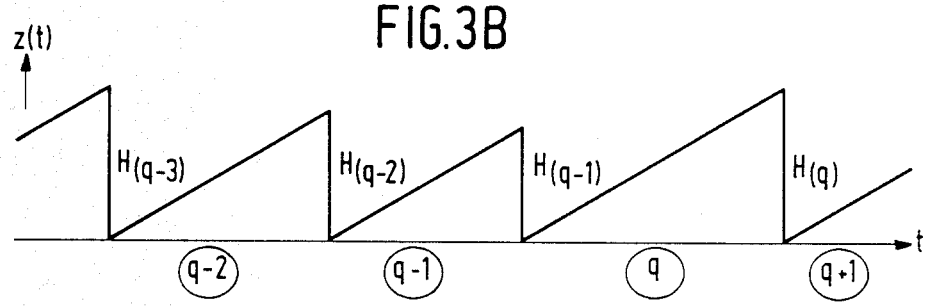

When the loop is not locked, there is a phase difference between two low-rate clock pulses. This situation is shown for completeness' sake in FIG. 3. More particularly FIG. 3 shows at A a number of low-rate clock pulses cl$_l$(.), at B a number of synthetic low-rate clock pulses cl'$_l$(.) and at C the output signal z(t) of oscillator 305.

When the loop is locked, there is a minimum phase difference between the two low-rate clock pulse signals cl$_l$ and cl'$_l$. This situation is shown for completeness' sake in FIG. 4. More particularly this FIG. 4 shows at A again a number of low-rate clock pulses cl$_l$(.), at B a number of low-rate clock pulses cl'$_l$(.) and at C the output signal z(t) of oscillator 305.

Figure 5:
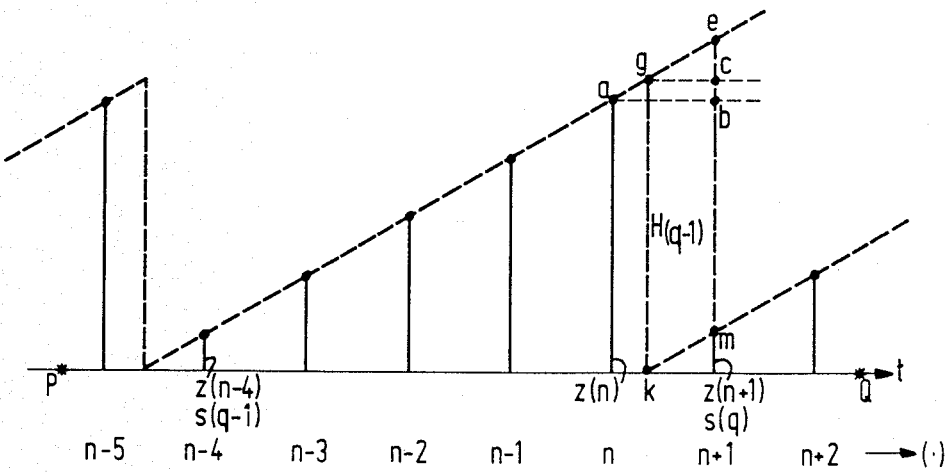
Figure 4A:
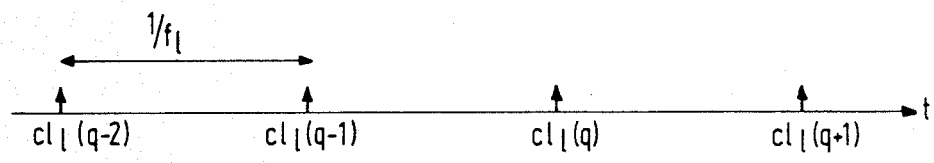
Figure 4B:
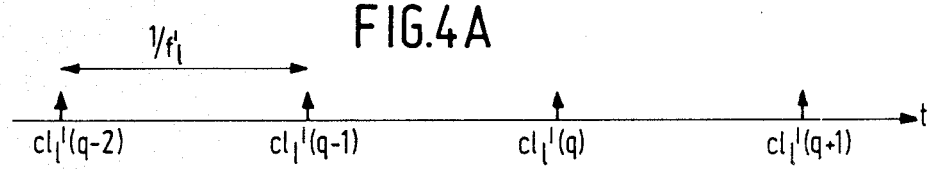
Figure 4C:
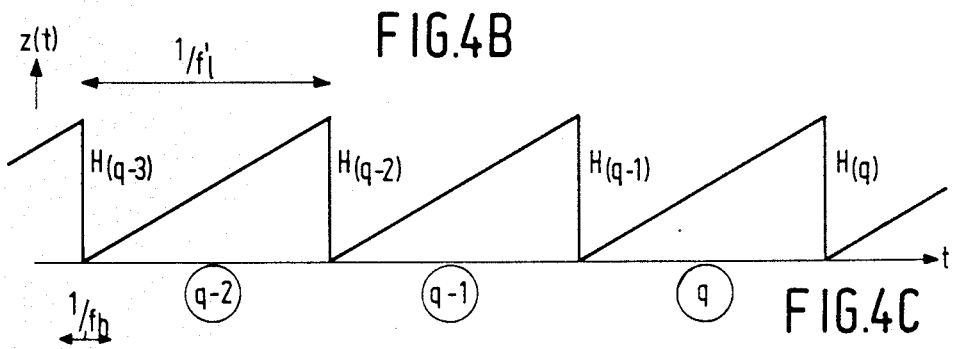
Figure 4D:
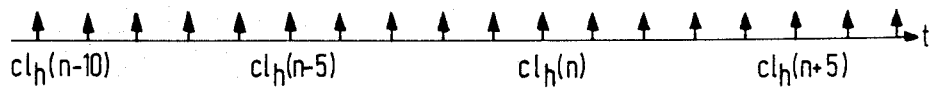
Figure 4E:
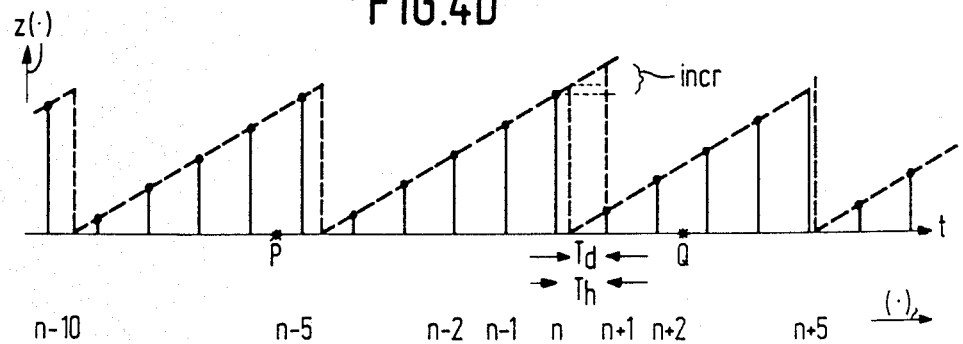

As is shown in FIG. 2, the output signal z(t) of the sawtooth oscillator 305 is first sampled in the sampler 307 for calculating the consecutive deviations d(.), the high-rate clock pulses cl$_h$(.) being used as sampling pulses. A number of these high-rate clock pulses is shown at D in FIG. 4. In response to these clock pulses the sampler supplies the sawtooth samples z(.) shown at E in FIG. 4 of the sawtooth signal z(t) shown at C in FIG. 4. In the diagram shown at E the original sawtooth signal is shown in broken lines for completeness' sake. These sawtooth samples z(.) are furthermore applied to a calculator circuit 308 for calculating a new deviation d(.) whenever a control pulse SP has occurred and applying this deviation to its output. To indicate how this deviation d(.), which is mathematically formulated in expression (2), is calculated by using the sawtooth samples z(.), the part of the diagram shown at E in FIG. 4 between the points P and Q is enlarged in FIG. 5. In this Figure a number of points have been indicated by a, b, c, e, g, k, m. In accordance with expression (2) there applies that:

$$d(q) = T_{d(q)} \cdot f_h.$$

In this expression $T_{d(q)}$ represents the distance between the low-rate clock pulse cl$_l$(q) and the immediately subsequent high-rate clock pulse cl$_h$(n+1), or the immediately preceding high-rate clock pulse cl$_h$(n). The starting point hereinafter will be that $T_{d(q+1)}$ is the distance between cl$_l$(q) and cl$_h$(n+1) so that this distance corresponds to the line section gc. The reciprocal value $T_h$ of $f_h$ represents the distance between two consecutive sawtooth samples and thus corresponds to the length of the line section ab. Furthermore, the line sections gk and em correspond to H(q−1) and the length of the line section ec corresponds to z(n+1). Since each sawtooth has the same slope, the difference between two consecutive sawtooth samples within one and the same period is constant. This constant has the magnitude incr. Since the line section eb represents such a difference, the length of this line section corresponds to incr. In accordance with the known rules of planimetry it then follows that $$d(q) = z(n+1)/\text{incr}. \tag{3}$$

It follows that for calculating the deviation d(.) it is sufficient to know the value of the first sawtooth sample taken from a sawtooth.

The present invention is based on the recognition that this sawtooth sample can be calculated and that the consequence thereof is that the sawtooth oscillator 305 shown in FIG. 2 is no longer physically present in the sample rate converter according to the invention. More particularly z(n+1) can be derived from z(n−4). In fact, as is apparent from FIG. 5:

$$z(n+1) = z(n-4) + 5 \text{ incr.} - H(q-1) \tag{4}$$

In this expression the number 5 indicates that z(n+1) is the fifth sawtooth sample after z(n−4). To generalize expression (4)m it is to be noted that a new sawtooth does not start until after a difference signal sample u(.) has occurred, while the $q^{th}$ sawtooth commences after the $q^{th}$ difference signal sample u(q) has occurred. When the first sawtooth sample taken from the $q^{th}$ sawtooth is represented by s(q) and when furthermore the number of high-rate clock pulses occurring within the period of this $q^{th}$ sawtooth (or, identically, the number of sawtooth samples from this $q^{th}$ sawtooth) is equal to N, there generally applies that $$s(q) = s(q-1) + N \text{ incr} - H(q-1) \tag{5}$$

so that $$d(q) = s(q)/\text{incr} = N + \{s(q-1) - H(q-1)\}/\text{incr} \tag{6}$$

In this expression the quantities s(q) and N are unknown. The quantity incr is fixed and known by choice. The quantity H(q−1) is supplied by the loop filter, the quantity s(q−1) is known because this is the result either of a preceding calculation or because it is a known initial value. In spite of all these known quantities expression (6) comprises s(q) as the desired quantity but also N as an unknown quantity. In order to be able to calculate the desired sawtooth sample s(q) it should be considered that $$0 \lesssim s(q) < \text{incr} \tag{7}$$

and hence $$0 \lesssim s(q)\text{incr} < 2^0 \tag{8}$$

while $N \gtrsim 2^0$ (9)

In other words, if a number P can be found which is equal to, for example, the difference $$p = -N + s(q)/\text{incr}$$

and which consists of the sum of two numbers $P_1$ and $P_2$ in which, for example, $P_1 < 1$ and $P_2 \gtrsim 1$, then it holds that $$d(q) = s(q)/\text{incr} = P_1$$

$$N = P_2 \tag{10}$$

Such a number P exists indeed and can be calculated. In accordance with expression (6)

$$-N + s(q)/\text{incr} = \{s(q-1) - H(q-1)\}/\text{incr} = P \tag{11}$$

(3) The processor 3022

Figure 6:
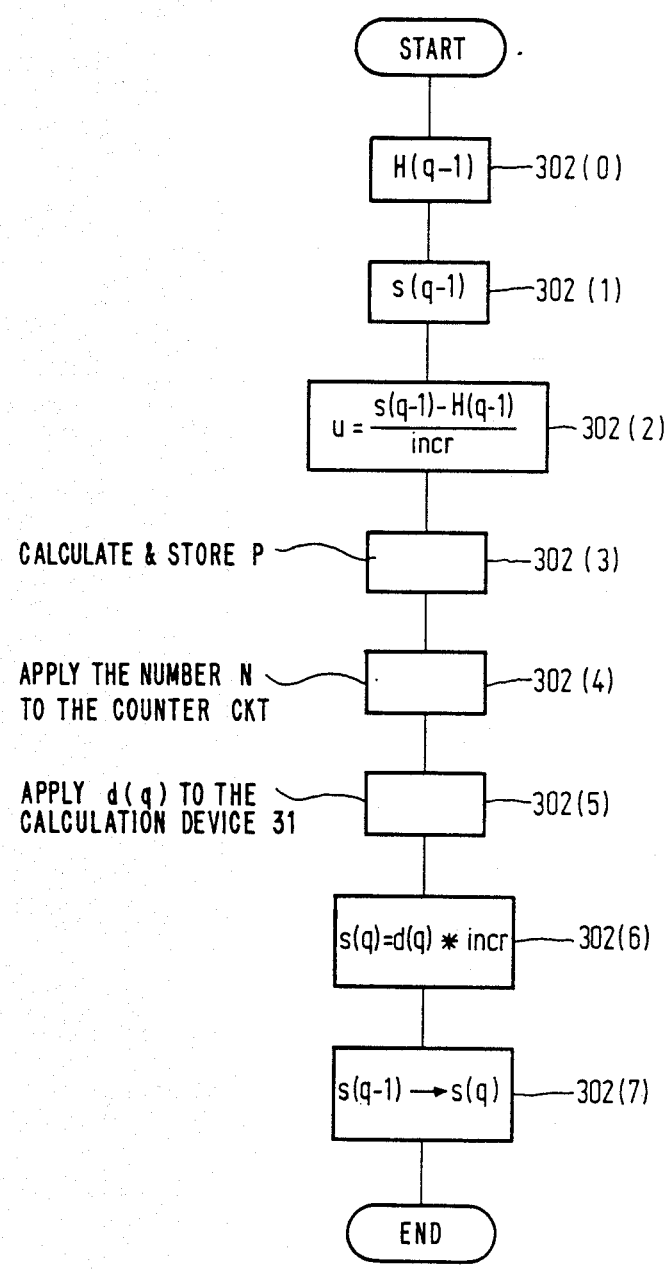
FIG. 6 shows the flow chart for programming the processor shown in FIG. 1.

The quantity P indicated in expression (11) us calculated by the processor 3022 which may be a microcomputer. It may be, for example, a microcomputer of the MAB 8000 family in which the steps shown in FIG. 6 are carried out. A calculation cycle starts some time after the phase detector 301 has supplied a control pulse SP. After the last supplied phase difference sample has given a contribution to the new control sample $H(q-1)$ which is supplied by the loop filter, this sample $H(q-1)$ is read by the processor and stored in a work register intended for this purpose (step 302(0)). Subsequently, the last calculated sawtooth sample $s(q-1)$ stored in a storage location intended for this purpose and referred to as S store is transferred to a further work register (step 302(1)). These two data are subsequently subtracted from each other in a step 302(2) and divided by the number incr. As a result, the desired number P is obtained which is stored in a P-register (step 302(3)). In a step 302(4) the bits of P having a significance which is larger than or equal to $2^0$ and thus represent the number N are subsequently applied to the counter circuit. In a further step 302(5) the bits of P having a significance of less than $2^0$ and thus representing the deviation d(q) are applied to the calculation device 31. Subsequently, the deviation d(q) is multiplied by the number incr in a step 302(6) so that the number s(q) is obtained. Finally, the sawtooth sample $s(q-1)$ is replaced by s(q) in the S store in a step 302(7).

(4) The loop filter

Figure 7:
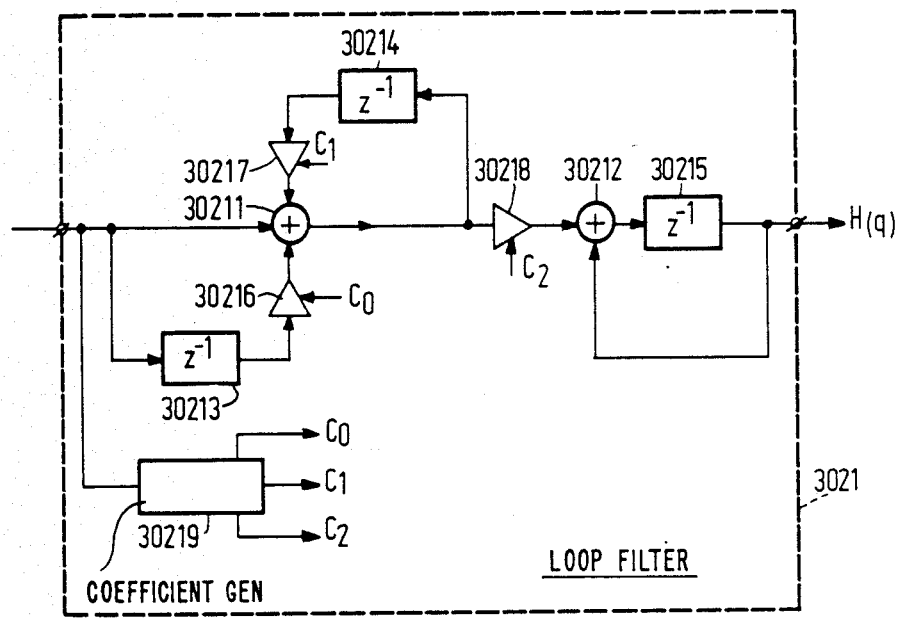
FIG. 7 shows an embodiment of a loop filter.

FIG. 7 shows an embodiment of a loop filter 3021. It is of the discrete-time type and comprises counter circuits 30211 and 30212, three delay circuits 30213, 30214 and 30215 each having a delay period $T_1$ and three multipliers 30216, 30217 and 30218 with the respective multiplication coefficients $C_0$, $C_1$ and $C_2$ supplied by a coefficient generator 30219. These elements are interconnected in the manner shown in the Figure such that a transfer function is realised which is equal to:

$$C_2(1 + C_0 Z^{-1})/(1 - Z^{-1})(1 - C_1 Z^{-1}) \tag{12}$$

In a practical embodiment the multiplication coefficients were chosen as follows:

$$C_0 = b - 1$$

$$C_1 = 1 - 32b \tag{13}$$

$$C_2 = -\tfrac{1}{4} W^2$$

$$b = 2^{-7} W.$$

W is a number to be chosen in the range of $10^{-2}$ to $10^{-7}$ inclusive. This number W need not be a fixed number. In the embodiment shown the coefficient generator 30219 receives the phase difference signal and based thereon it calculates a value for W so as to calculate subsequently the coefficients with this value for W in accordance with expression (13). The loop filter thus obtained is referred to as an adaptive filter.

As is known, the embodiment of the loop filter shown in FIG. 7 may also be considered as a flow diagram for a software implementation. This means that such a loop filter can also be implemented in known manner in software in the processor 3022.

(5) The phase detector

Figure 8:
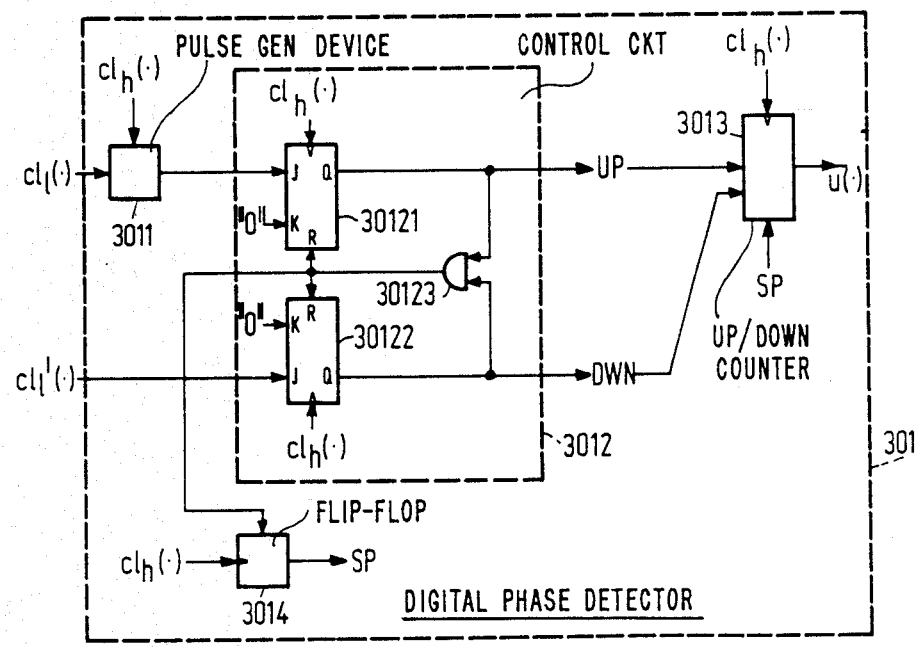
FIG. 8 shows an embodiment of a digital phase detector.

FIG. 8 shows an embodiment of a digital phase detector 301. It is provided with a device pulse generator 3011 to which the low-rate clock pulses $cl_l(.)$ are applied. After having received a clock pulse $cl_l(.)$ this device supplies a pulse in phase with a high-rate clock pulse $cl_h(.)$. The output signal of this device 3011 as well as the synthetic low-rate clock pulses $cl'_l(.)$ are applied to a control circuit 3012 supplying an up command UP or a down command DWN for an up-down counter 3013. The latter counter also receives the high-rate clock pulses $cl_h(.)$ as counting pulses. The contents of this counter are transferred to the processor circuit at the instant when the control pulse SP occurs.

In the embodiment shown the control circuit 3012 consists of 2 JK flip-flops 30121 and 30122 and an AND gate 30123 which are connected together in the manner shown. The JK flip-flops are of the type having a clock pulse input. The high-rate clock pulses are applied thereto.

The pulse supplied by AND-gate 30123 resets the two JK flip-flops and also set a further flip-flop 3014 which in response thereto, supplies the previously mentioned control pulse SP starting, inter alia, the program shown in FIG. 6.

What is claimed is:

1. An arrangement for changing the sampling frequency of a discrete-time signal having a value $f_i$ into a value $f_u$, one of said two sampling frequencies being equal to $f_l$ and the other being equal to a higher frequency $f_h$, said arrangement comprising:
   (a) first means for supplying low-rate clock pulses occurring at the said rate $f_l$;
   (b) second means for supplying high-rate clock pulses occurring at the said rate $f_h$;
   (c) a filter coefficient generator comprising:
   (c1) a deviation circuit to which the low and high-rate clock pulses are applied and which supplies a deviation d which is equal to the product of $f_h$ and a time interval $T_d$ between a low-rate clock pulse and the immediately subsequent or the immediately preceding high-rate clock pulse;
   (c2) means to generate a predetermined number of (M) filter coefficients in response to the supplied deviation d, the filter coefficient having ordinal number m being equal to a(m) and being defined by the relation $$a(m) = h[(d+m)/f_h]$$

wherein the function h represents the pulse response of a finite impulse response filter and $m = 0, 1, 2, \ldots M-1$; and (d) a signal processing circuit for generating at a rate $f_u$ the samples of the discrete-time signal having the changed sampling frequency by multiplication of samples of the original discrete-time signal by selected filter coefficients and by adding the products thus obtained;

wherein the deviation circuit comprises:

(c1,1) a phase detector to which the low-rate clock pulses are applied on the one hand and to which synthetic low-rate clock pulses are applied on the other hand and which supplies a discrete-time phase difference signal;

(c1,2) a counter circuit adapted to receive a reference value, which circuit receives the high-rate clock pulses as counting pulses and supplies a synthetic low-rate clock pulse each time after receiving a number of high-rate clock pulses which is equal to the reference value; and (c1,3) a processor circuit receiving the discrete-time phase difference signal and in response thereto supplying deviators and reference values for the counter circuit at the rate $f_l$.

2. An arrangement as claimed in claim 1, wherein the processor circuit is adapted to perform a discrete-time filtering on the discrete-time phase difference signal for generating control signal samples.

3. An arrangement as claimed in claim 2, wherein the discrete-time filtering is described by the transfer function $$C_2(1 + C_0 Z^{-1})/(1 - Z^{-1})(1 - C_1 Z^{-1})$$

wherein $C_0$, $C_1$ and $C_2$ are multiplication coefficients.

4. An arragement as claimed in claim 2, wherein the processor circuit is further comprises:

(a) means for calculating a difference quantity (P) which is equal to the difference between an actual control sample and an auxiliary sample divided by a fixed weighting factor;

(b) means for applying those bits of the difference quantity P that have a significance which is less than $2^o$ as a deviation (d) to the means generating the filter coefficients and applying the other bits of this difference quantity as a reference value to the counter circuit; and (c) means for calculating a new auxiliary sample by multiplication of the deviation d obtained in step b by the weighting factor.

* * * * *